United States Patent
Vedavyasan et al.

(10) Patent No.: US 11,755,801 B1
(45) Date of Patent: Sep. 12, 2023

(54) DATA FLOW GRAPH REFINEMENT USING RANGE SET INFORMATION FOR IMPROVED SYNTHESIS

(71) Applicant: Xilinx, Inc., San Jose, CA (US)

(72) Inventors: Kishore Vedavyasan, Hyderabad (IN); Sumanta Datta, Hyderabad (IN); Aman Gayasen, Hyderabad (IN); Sriram Govindarajan, Fremont, CA (US)

(73) Assignee: Xilinx, Inc., San Jose, CA (US)

( * ) Notice: Subject to any disclaimer, the term of this patent is extended or adjusted under 35 U.S.C. 154(b) by 137 days.

(21) Appl. No.: 17/107,367

(22) Filed: Nov. 30, 2020

(51) Int. Cl.
*G06F 30/3312* (2020.01)

(52) U.S. Cl.
CPC .............................. *G06F 30/3312* (2020.01)

(58) Field of Classification Search
CPC .................................................. G06F 30/3312
USPC ...................................................... 703/14, 15
See application file for complete search history.

(56) References Cited

U.S. PATENT DOCUMENTS

| | | | | |
|---|---|---|---|---|
| 7,257,802 B2* | 8/2007 | Daw | ..................... | G06F 30/331 716/106 |
| 7,958,476 B1* | 6/2011 | Jiang | ..................... | G06F 30/327 716/109 |
| 8,079,000 B2* | 12/2011 | Koelbl | ................ | G06F 30/3323 716/108 |
| 10,534,885 B1 | 1/2020 | Datta et al. | | |

* cited by examiner

*Primary Examiner* — Juan C Ochoa
(74) *Attorney, Agent, or Firm* — Kevin T. Cuenot

(57) ABSTRACT

Implementing a circuit design within an integrated circuit can include converting the circuit design, specified in a hardware description language, into a data flow graph and creating range set data structures in a memory. The range set data structures correspond to nodes of the data flow graph. Each range set data structure can be initialized with a range of values the corresponding node can take as specified by the circuit design. The method can include determining actual values the nodes are capable of taking by propagating the values through the data flow graph. The range set data structures are updated to store the actual values for the corresponding nodes. The method also can include modifying a selected node of the data flow graph based on the actual values stored in the range set data structure of the selected node and semantics of the selected node.

20 Claims, 8 Drawing Sheets

```
300    module top(input bit [3:0 sel, output bit [3:0] out1, bit [3:0]out2);
           bit [4:] addResult;
           always @(sel) begin
               if(sel == 1)
                   out1 <= 5;
               else
                   out1 <= 4
           end
           always @(out1) begin
               addResult = out1 +3;
               case (addResult)
                   5 : out2 <= 11
                   7 : out2 <= 22;
                   9 : out2 <= 33;
                   default : out2 <= 44;
               endcase
           end
       endmodule
```
FIG. 3
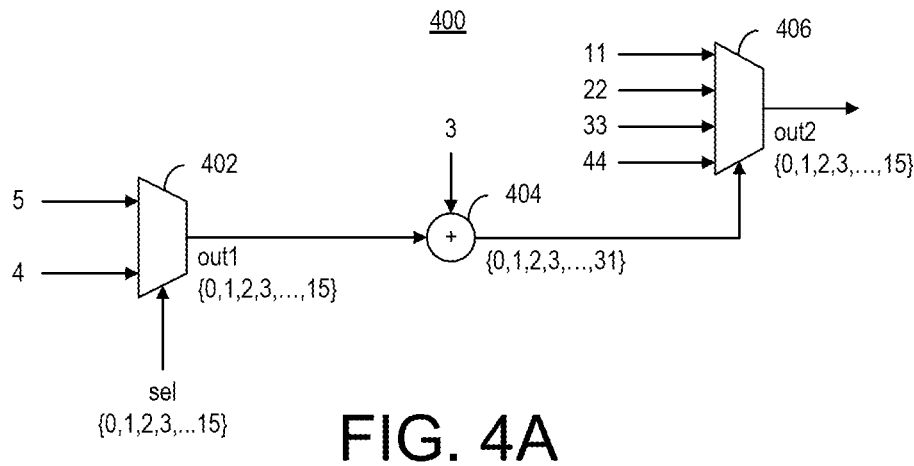
FIG. 4A
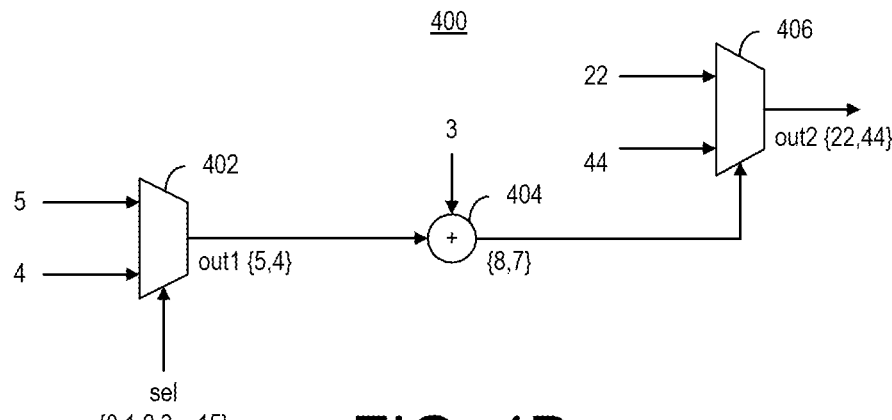
FIG. 4B

```
500    case ( LLLL ) is
               when x"7" => GGGG :=GGGG_7;
               when x"6" => GGGG :=GGGG_6;
               when x"5" => GGGG :=GGGG_5;
               when x"4" => GGGG :=GGGG_4;
               when x"3" => GGGG :=GGGG_3;
               when x"2" => GGGG :=GGGG_2;
               when x"1" => GGGG :=GGGG_1;
               when others => GGGG :=GGGG_0;
       end case;
       MMMM := (GGGG + HHHH – 16#0002_5000# ) / 4;
       if ( RRRR = '1' ) then
               JJJJ := PARAM_1( MMMM );
       else
               JJJJ := PARAM_2( MMMM );
       end if;
```
FIG. 5
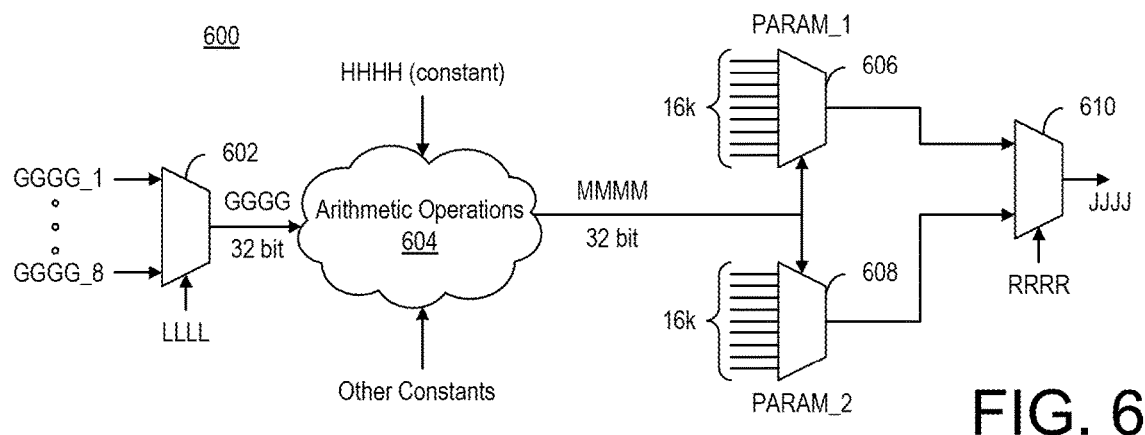
FIG. 6A
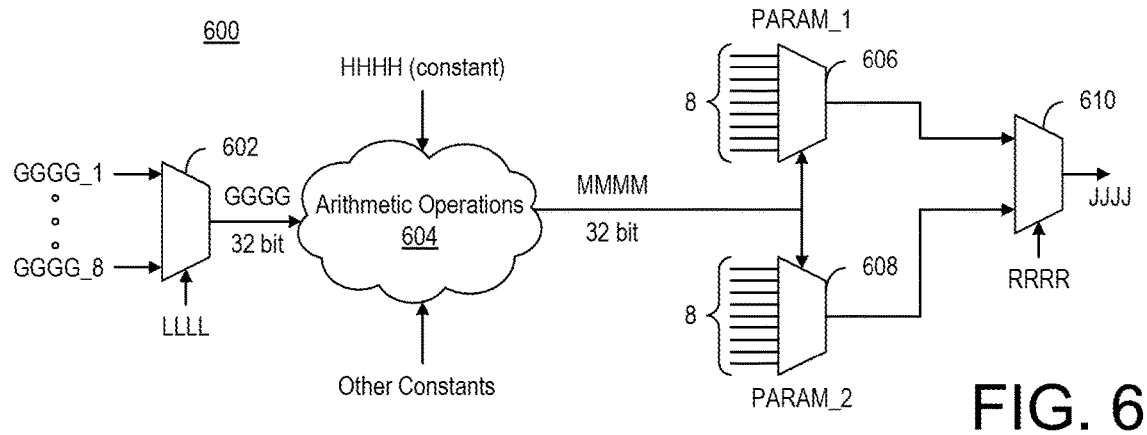
FIG. 6B

```
01| S_offset <= 16 when I_PAGE_FLG = '0' else 0 ;
02| Case sr_ix is
03|       when 216 to 225  891 to 900 =>
04|              if(I_PAGE_FLG = '1') then
05|                     for I in 31 downto 0 loop
06|                            sr_result_row(i) <= sr_result_row(i)(35 downto 0) & "0000";
07|                     end loop;
08|              end if;
09|       when others =>
10|              if (sr_cnt_row_en = '1' ) then
11|                     for I in 15 downto 0 loop
12|                            sr_result_row(I+s_offset) <= r_row_enc900_1bit( (I_IMDT1(i), sr_result_row(i+s_offset));
13|                     end loop;
14|              else sr_result_row <= (others=>(others=>'0'));
15|              end if
16| end case;
```
FIG. 7
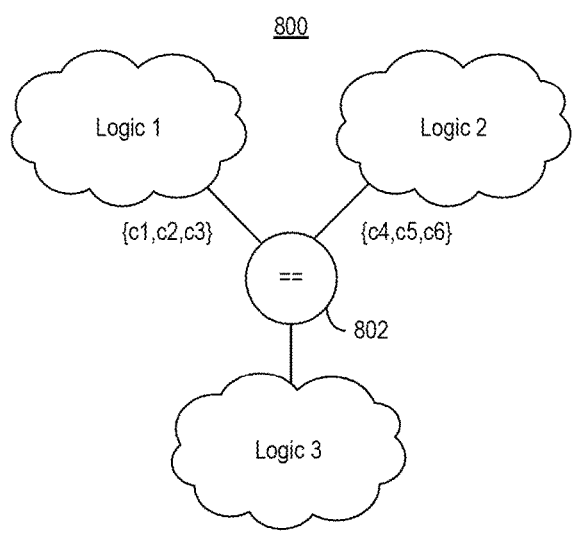
FIG. 8A
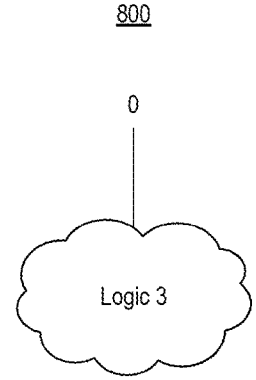
FIG. 8B

1000

Convert a circuit design, specified in a hardware description language, into a data flow graph
1002

Create range set data structures in memory, the range set data structures corresponding to nodes of the data flow graph, wherein each range set data structure is initialized with a range of values the corresponding node can take on as specified by the circuit design
1004

Determine actual values the nodes are capable of taking on by propagating the values through the data flow graph, wherein the range set data structures are updated to store the actual values for the corresponding nodes
1006

Modify a selected node of the data flow graph based on the actual values stored in the range set data structure of the selected node and semantics of the selected node
1008

FIG. 10

DATA FLOW GRAPH REFINEMENT USING RANGE SET INFORMATION FOR IMPROVED SYNTHESIS

RESERVATION OF RIGHTS IN COPYRIGHTED MATERIAL

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

This disclosure relates to integrated circuits (ICs) and, more particularly, to refining a data flow graph corresponding to a circuit design using range set information for improved synthesis.

BACKGROUND

For the design of digital circuits (e.g., on the scale of Very Large-Scale Integration (VLSI) technology), designers often employ computer aided techniques. Standard languages such as Hardware Description Languages (HDLs) have been developed to describe digital circuits to aid in the design and simulation of complex digital circuits. Several hardware description languages, such as VHDL and Verilog, have evolved as industry standards. HDLs allow the definition of a hardware model at the register transfer level (RTL) using abstract data types. As device technology continues to advance, various product design tools have been developed to adapt HDLs for use with newer devices and design styles.

To implement a circuit design within an integrated circuit (IC), the circuit design undergoes a multi-stage process referred to as a design flow. In general, the design flow includes synthesis, placement, and routing. Synthesis refers to the process of transforming a circuit design specified in an HDL into a gate-level representation referred to as a netlist. The circuit design is typically a technology independent description. The netlist may be technology specific in that the netlist is intended for implementation in a particular IC referred to as a "target IC." Placement refers to the process of assigning elements of the synthesized circuit design to particular instances of circuit blocks and/or resources having specific locations on the target IC. Routing refers to the process of selecting or implementing particular routing resources, e.g., wires and/or other interconnect circuitry, to electrically couple the various circuit blocks of the target IC after placement. The resulting circuit design, having been processed through the design flow, may be implemented within the target IC.

SUMMARY

In one aspect, a computer-based method can include converting a circuit design, specified in a hardware description language, into a data flow graph and creating range set data structures in a memory. The range set data structures correspond to nodes of the data flow graph. Each range set data structure can be initialized with a range of values the corresponding node can take as specified by the circuit design. The method can include determining actual values the nodes are capable of taking by propagating the values through the data flow graph. The range set data structures are updated to store the actual values for the corresponding nodes. The method also can include modifying a selected node of the data flow graph based on the actual values stored in the range set data structure of the selected node and semantics of the selected node.

In another aspect, a system includes a processor configured to initiate operations. The operations can include converting a circuit design, specified in a hardware description language, into a data flow graph and creating range set data structures in a memory of the system. The range set data structures correspond to nodes of the data flow graph. Each range set data structure can be initialized with a range of values the corresponding node can take as specified by the circuit design. The operations can include determining actual values the nodes are capable of taking by propagating the values through the data flow graph. The range set data structures are updated to store the actual values for the corresponding nodes. The operations also can include modifying a selected node of the data flow graph based on the actual values stored in the range set data structure of the selected node and semantics of the selected node.

In another aspect, a computer program product includes one or more computer readable storage media, and program instructions collectively stored on the one or more computer readable storage media. The program instructions are executable by computer hardware to initiate operations. The operations can include converting a circuit design, specified in a hardware description language, into a data flow graph and creating range set data structures in a memory of the system. The range set data structures correspond to nodes of the data flow graph. Each range set data structure can be initialized with a range of values the corresponding node can take as specified by the circuit design. The operations can include determining actual values the nodes are capable of taking by propagating the values through the data flow graph. The range set data structures are updated to store the actual values for the corresponding nodes. The operations also can include modifying a selected node of the data flow graph based on the actual values stored in the range set data structure of the selected node and semantics of the selected node.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

FIG. 3 illustrates an example circuit design specified in a hardware description language (HDL).

FIGS. 4A and 4B illustrate example data flow graphs (DFGs) generated from the example circuit design of FIG. 3.

FIG. 5 illustrates another example circuit design specified in an HDL.

FIGS. 6A and 6B illustrate example DFGs generated from the example circuit design of FIG. 5.

FIG. 7 illustrates another example circuit design specified in an HDL.

FIGS. 8A and 8B illustrate additional example DFG modifications.

FIG. 10 illustrates an example method of processing a circuit design for implementation in a target integrated circuit (IC).

DETAILED DESCRIPTION

Figure 1:
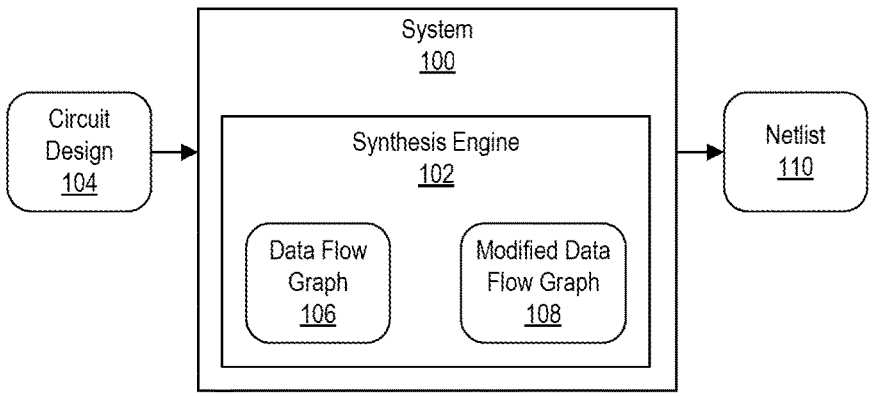
FIG. 1 illustrates an example system configured to process a circuit design for implementation in a target IC.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to refining a data flow graph corresponding to a circuit design using range set information for improved synthesis. To implement the circuit design within an IC, the circuit design undergoes a multi-stage process referred to as a design flow that generally includes synthesis, placement, and routing. The design flow is performed using a computer-based system also referred to as an Electronic Design Automation (EDA) system.

In accordance with the inventive arrangements described within this disclosure, methods, systems, and computer program products are provided that are capable of processing a circuit design for implementation in a target IC where the resulting circuitry has an improved Quality of Result (QOR) compared to other available techniques for implementing circuit designs that lack the refinements described within this disclosure. Examples of the improvements to QOR that may be achieved using the example implementations described here may include the resulting circuitry, as implemented in the target IC, using fewer circuit resources of the target IC, having fewer logic levels, consuming less power, operating with reduced latency, and/or having an increased operating or clock speed.

In one or more example implementations, a system is capable of transforming a circuit design specified in a hardware description language (HDL) into a data flow graph (DFG) representation of the circuit design. The system is capable of refining the DFG to improve the QOR of the resulting circuitry implemented in the target IC. The improvements to QOR may be achieved while maintaining functional equivalence to the original circuit design.

In one or more example implementations, the system is capable of generating range set information for nodes of the DFG. The range set information for a given node of the DFG is capable of specifying the actual value or values, referred to as the "range set," that the node of the DFG may take on as opposed to storing every potential value that the node may take on, referred to as the "range." By determining the actual values that nodes of the DFG may take on, the system is capable of modifying the DFG in various ways. The modifications may include pruning (e.g., reducing) the size of nodes, pruning (e.g., removing) entire nodes from the DFG, and/or pruning entire sections or branches of the DFG. These types of refinements to the DFG may be carried forward through netlist generation and other stages of the design flow to achieve the gains in QOR previously described.

In one or more example implementations, Boolean Space refinements may be implemented that use interval sets to improve the QOR of circuit designs that include multiplexers. By enumerating the individual values nodes of the DFG can take on within the range set information, the system is capable of using constant and range propagation through the DFG to reduce the size of the resulting netlist that is generated. The example implementations described herein are capable of operating on range set information that includes contiguous ranges and/or non-contiguous ranges.

Further aspects of the inventive arrangements are described below in greater detail with reference to the figures. For purposes of simplicity and clarity of illustration, elements shown in the figures have not necessarily been drawn to scale. For example, the dimensions of some of the elements may be exaggerated relative to other elements for clarity. Where considered appropriate, reference numbers are repeated among the figures to indicate corresponding, analogous, or like features.

FIG. 1 illustrates an example system 100 configured to process a circuit design for implementation in a target IC. In one aspect, system 100 may be implemented as a computer executing suitable software. For example, system 100 may be implemented as an EDA system. An example hardware architecture for system 100 is described herein in connection with FIG. 11. Synthesis engine 102 may be implemented in hardware, e.g., as dedicated circuitry; program code executed by one or more processors of system 100; or a combination thereof. Synthesis engine 102 is capable of performing the various operations described within this disclosure.

In the example of FIG. 1, synthesis engine 102 processes a circuit design 104 and generates, from circuit design 104, a netlist 110. Circuit design 104 may be specified using an HDL. Circuit design 104 may also be specified as a register transfer level (RTL) representation. In one aspect, circuit design 104 may be a technology independent representation or model of a digital circuit. Netlist 110 may be technology specific for a target IC. An example architecture for a target IC is described herein in connection with FIG. 12.

In one or more example implementations, synthesis engine 102 is capable of converting circuit design 104 into a DFG 106. DFG 106 is stored as a data structure in a memory of system 100. In general, a DFG is a graph that represents data dependencies. The DFG includes nodes and edges connecting the nodes. Each node of DFG 106, for example, represents a variable or an operation performed on one or more variables from circuit design 104. The nodes are connected by edges that represent data flowing between the nodes. The variables and operations performed on the variables have semantics that are unambiguously stipulated by the Language Reference Manual (LRM) of the particular HDL that is used.

In one aspect, synthesis engine 102 is capable of creating range set data structures in the memory of system 100. The range set data structures correspond to the nodes of DFG 106. The nodes of DFG 106 are capable of accepting a discrete range of values. Synthesis engine 102 is capable of initializing each range set data structure with the range the corresponding node of DFG 106 can take on as specified by circuit design 104. As noted, the range refers to the entire range of values the node can take on. For example, if a particular node is capable of outputting a 4-bit value, as determined from circuit design 104, the range initialized in the data structure for the node in DFG 106 may be 0-15.

Synthesis engine 102 also is capable of determining the actual values the nodes of DFG 106 are capable of taking on by propagating the values through DFG 106. Synthesis engine 102 is capable of propagating the set of values each node in DFG 106 can take on and updating the range set data structures to store these actual values, referred to as the "range set" for the corresponding nodes. For purposes of description, the range set for a given node may also be referred to as "validated" values.

Synthesis engine 102 is capable of operating on, and refining, DFG 106 to generate modified DFG 108. Based on the actual, or validated, values stored in the range set data structure of one or more selected nodes of DFG 106 and/or the semantics of the one or more selected nodes, synthesis engine 102 is capable of modifying the one or more selected nodes of DFG 106 to generate modified DFG 108. Synthesis engine 102, for example, is capable of pruning DFG 106 based on the size of the nodes contained therein using the range set information stored in the range set data structures. These operations, which effectively reduce the size of DFG 106 and/or reduce the size of nodes of DFG 106 refine DFG 106 to generate modified DFG 108. Synthesis engine 102 is capable of generating netlist 110 from modified DFG 108.

Figure 2:
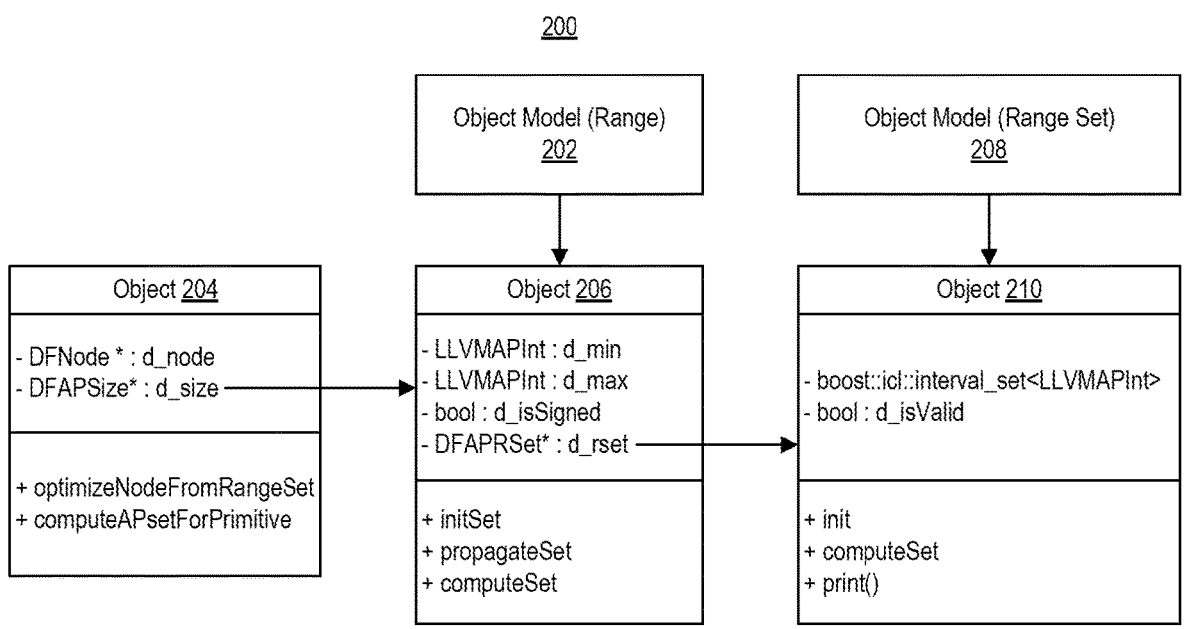
FIG. 2 illustrates an example data structure for storing range set information.

FIG. 2 illustrates an example range set data structure 200 configured to store range set information in accordance with the inventive arrangements described within this disclosure. Data structure 200 is depicted in FIG. 2 as a class diagram. Range set data structure 200 may be created by synthesis engine 102 on a per node basis for nodes in DFG 106. In the example of FIG. 2, range set data structure 200 includes object models 202 and 208. Object model 202 is configured to store range information and includes objects 204 and 206. Object model 208 is configured to store range set information and includes object 210.

Object 204 may be linked to a particular node of DFG 106. For example, object 204 includes a "DFNode" parameter that specifies a particular node of DFG 106 to which object 204 is linked. Since objects 204, 206, and 210 are linked, any data specified by objects 204, 206, and 210 correspond to the linked node of DFG 106. The DFAPSize parameter of object 204 points to object 206, e.g., establishes a link thereto. Each object also may include one or more functions. For example, object 204 may include an "optimizeNodeFromRangeSet" function and a "computeAPsetForPrimitive" function.

Object 206 is capable of storing the range information for the corresponding node. For example, object 206 may include a parameter "LLVMAPInt:d_min" that specifies a minimum value of the range information for the node and a parameter "LLVMAPInt:d_max" that specifies a maximum value for the range information for the node. Object 206 further includes a parameter DFGPRSet that points to object 210. Object 206 may include an "initSet" function, a "propagateSet" function, and a "computeSet" function.

Object 210 is capable of specifying range set information for the node, e.g., the actual value or values that the node linked to by DFNode of object 204 is capable of taking on. For example, object 210 may include a "boost::icl::interval_set" parameter capable of specifying the actual values the corresponding node of DFG 106 is capable of taking on. Object 210 may include a "bool:d_isValid" parameter. Object 210 may include an "init" function, a "computeSet" function, and a "print( )" function.

The various functions illustrated in the class diagram are provided for purposes of illustration and not limitation. Fewer or more functions may be included. Accordingly, the inventive arrangements described herein are not intended to be limited to the examples provided. In the example of FIG. 2, the example functions may be used to store and manipulate the data described herein in an object-oriented manner. The Boolean value "isValid" may be included to disable the various refinements described herein.

In one aspect, object 210 may be implemented as an interval set of an LLVM APInt object. The LLVM library is a collection of modular and reusable compiler and toolchain technologies. APInt is an arbitrary precision integer type object included in the LLVM library. The APInt object is flexible in that the object is capable of storing values of virtually any size without the overhead of having to manage overflow or truncation. The APInt object also includes a set of Application Programming Interfaces (APIs) that are capable of performing a variety of arithmetic and logical operations on the data structure. In an example implementation, the interval set data structure may be implemented using the Boost C++ library, where the interval data set data structure is capable of holding one or more contiguous ranges of values that allow operations on the range set data to be performed with low memory utilization and reduced runtime. Range set data structure 200 may be included within DFG 206 for the respective nodes or may be separate data structures linked to nodes of DFG 206.

Accordingly, in the example of FIG. 2, rather than storing each individual value that a node is capable of taking on (e.g., each actual or validated value), object 210 is capable of storing a set of one or more contiguous ranges. As an illustrative and non-limiting example, in the event that a node is capable of taking on values of {1, 2, 3, 5, 6, 7}, object 210 may represent and store these actual values as range set information in the form of a first contiguous range of {1:3} and a second contiguous range of {5:7} within the APInt object.

FIG. 3 illustrates an example circuit design 300 specified in HDL. FIGS. 4A and 4B illustrate example DFGs 400 generated from circuit design 300. Within this disclosure, the nodes of DFGs have types that correspond to the circuitry represented by each respective node or nodes. For example, a node may be referred to as a multiplexer, an adder, a shifter, etc., where such designations are the types of the respective nodes of the DFG. The type of node of a DFG is specified as part of the semantics of the node. The semantics of the node further may specify information such as the number of inputs to the node, the number of outputs from the node, and/or the size of the node.

Synthesis engine 102 is capable of generating DFG 400 of FIG. 4A from circuit design 300. In the example of FIG. 4A, the select signal (sel) provided to multiplexer 402, the output generated by multiplexer 402 (out1), and the output generated by multiplexer 406 (out2) are 4-bit values. Based on the size of the signals, as specified by circuit design 300, each is capable of conveying any value from 0 to 15. The output from adder 404 is a 5-bit value. Based on the size of the output from adder 404, as specified by circuit design 300, the output of adder 404 may convey any value from 0 to 31. Initially, synthesizer engine 102 is capable of initializing the range set data structures for the respective nodes of DFG 400 with range information determined from the size of the various signals. For example, the range set data structure for multiplexer 402 is initialized to store range information corresponding to each possible output value of 0-15. The range set data structure for adder 404 is initialized to store the range information corresponding to each possible output value of 0-31.

In propagating values through nodes of DFG 400, synthesis engine 102 is capable of determining that despite multiplexer 402 being capable of outputting any value from 0 to 15, multiplexer 402 may only output actual values of 5 or 4 based on the inputs provided thereto. Similarly, while adder 404 is capable of outputting any value from 0 to 31, adder 404 is only capable of outputting actual values of 8 (5+3) or 7 (4+3). Accordingly, multiplexer 406 only receives a select signal having a value of 8 or a value of 7. This means that despite multiplexer 406 receiving 4 different values as inputs and being capable of outputting any value from 0 to 15, multiplexer 406 is only capable of output the actual value of 22 as selected by an 8 value on the select signal or an actual value of 44 as selected by a 7 value on the select signal.

In performing the foregoing propagation of actual values through DFG 400, synthesis engine 102 is capable of updating the range set data structures of the nodes of DFG 400 to specify the actual values that each respective node is capable of taking on as range sets. For example, multiplexer 402 is only capable of outputting the actual values of 5 or 4. Accordingly, synthesis engine 102 updates the range set data structure for multiplexer 402 to store range set information of {5, 4}. Adder 404 is only capable of outputting the actual values of 8 or 7. Synthesis engine 102 updates the range set data structure of adder 404 to store the range set information of {8, 7}. Multiplexer 406 is only capable of outputting the actual values of 22 or 24. Synthesis engine 102 updates the range set data structure for multiplexer 406 to store the range set information of {22, 44}. Synthesis engine 102 updates the range set information for the nodes of the DFG to specify these actual values.

Synthesis engine 102 is capable of modifying DFG 400 of FIG. 4A based on the actual values that the respective nodes of DFG 400 are capable of taking on. Accordingly, synthesis engine 102 generates a modified version of DFG 400 as shown in FIG. 4B. In the example of FIG. 4B, referring to multiplexer 406, the number of inputs may be reduced from 4 to 2. As a result, multiplexer 406 may be reduced in size from a 4-to-1 multiplexer shown in FIG. 4A down to a 2-to-1 multiplexer having inputs corresponding to input values of 22 and 44 as shown in FIG. 4B. Since the inputs corresponding to input values of 11 and 33 will never be selected, these inputs may be removed, or pruned, from multiplexer 406 thereby reducing the size of the resulting netlist and the amount of circuit resources of the target IC needed to implement circuit design 300. For example, fewer lookup table (LUT) circuit blocks are needed to implement circuit design 300.

FIG. 5 illustrates another example circuit design 500 specified in an HDL. FIGS. 6A and 6B illustrate example DFGs 600 generated from circuit design 500. Synthesis engine 102 is capable of generating DFG 600 of FIG. 6A from circuit design 500. In accordance with the inventive arrangements described herein, synthesis engine 102 is capable of initializing the range set data structures for the respective nodes of DFG 600 of FIG. 6A with range information determined from the size of the various signals as determined from circuit design 500.

As shown in FIG. 6A, the output GGGG from multiplexer 602 is sized at 32 bits. A 32-bit unsigned variable can take values in the range of [0: ((2^32)−1)], whereas a 32-bit signed variable can take values in the range of [−2^31: ((2^31)−1)]. Appreciably, the particular data type ranges may be specified in the Language Reference Manual for the corresponding HDL. Similarly, the output MMMM from arithmetic operations 604 is sized at 32 bits and is capable of specifying the same range of values as output GGGG. Each of multiplexers 606 and 608 is sized as a 16 k-to-1 multiplexer since each of multiplexers 606 and 608 have 16 k possible inputs. That is, each of PARAM_1 and PARAM_2 may be an array with 16 k elements.

Synthesis engine 102 is capable of propagating values through DFG 600 to determine that multiplexer 602 outputs one of only 8 possible values despite being 32 bits in size. Synthesis engine 102 is capable of determining that since arithmetic operations 604 apply only constants to the received input from multiplexer 602, output MMMM from arithmetic operations 604 will also be one of only 8 possible values despite being 32 bits in size. Signal MMMM is provided to each of multiplexers 606 and 608 as a select signal.

By propagating the actual values through the nodes of DFG 600 and updating the range set information in the range set data structures corresponding to the nodes of DFG 600 to specify the actual values the nodes are capable of taking on, synthesis engine 102 is capable of determining that each of multiplexers 606 and 608 is capable of outputting 1 of only 8 possible values of the 16 k arrays as opposed to any of the 16 k values of the respective arrays. These 8 possible values will not change, meaning that other values of the arrays will never be selected.

Accordingly, synthesis engine 102 modifies DFG 600 of FIG. 6A, for example, by reducing the size of multiplexers 606 and 608 by removing inputs that will never be selected or passed. In consequence, synthesis engine 102 is capable of implementing each of multiplexers 606 and 608 as an 8-to-1 multiplexer as shown in DFG 600 of FIG. 6B as opposed to a 16 k-to-1 multiplexer as shown in FIG. 6A. The output of multiplexers 606 and 608 is provided to multiplexer 610.

In the traditional case, as reflected in FIG. 6A, each of multiplexers 606 and 608, being associated with a respective array of 16 k elements, would be implemented as a large multiplexer structure capable of selecting any of the 16 k different entries. The refinements to DFG 600 performed by synthesis engine 102 significantly reduce the size of the resulting netlist and circuitry implemented in the target IC.

FIG. 7 illustrates another example circuit design 700 specified in an HDL. In the example of FIG. 7, line 12 is calling the function "f_row" and selecting a value based on the variable "s_offset." In the typical case, a synthesis process generates a DFG that accounts for each possible value that "f_row" may return based on each possible value of "s_offset." In the example of FIG. 7, "s_offset" may be a 16-bit value.

In accordance with the inventive arrangements described herein, synthesis engine 102 is capable of generating a DFG and imposing a restriction on the values that "s_offset" may take on based on line 1. Line 1 limits the value of "s_offset" to either 0 or 16 based on "I_PAGE_FLG." Synthesis engine 102 may update the range set data structures for the nodes of the DFG to indicate these actual values rather than the entire range of possible values that "s_offset" may take on. Synthesis engine 102 is capable of propagating the actual values through the DFG to simplify the multiplexer structure. As noted, this results in a simplified netlist and circuit implementation in the target IC that requires fewer circuit resources than would otherwise be the case.

FIGS. 8A and 8B illustrate additional example DFG modifications. FIG. 8A illustrates an example DFG 800 prior to modification by synthesis engine 102. FIG. 8B illustrates DFG 800 subsequent to modification by synthesis engine 102. In the example of FIG. 8A, DFG 800 includes logic 1 which is capable of generating the possible range of values {c1, c2, c3} and logic 2 which is capable of generating the possible range of values {c4, c5, c6}. Node 802 represents an equivalence operation performed on the outputs of logic 1 and logic 2.

Synthesis engine 102 is capable of propagating the range of values that are output from logic 1 and from logic 2 to determine that there is no overlap between the two limited ranges of values. That is, synthesis engine 102 is capable of recognizing that the input from logic 1 will never equal the input from logic 2 and that the only result that node 802 will ever generate is 0. Accordingly, synthesis engine 102 is capable of removing the segment of DFG 800 representing logic 1, removing the segment of DFG 800 representing logic 2, and removing node 802 of DFG 800 to generate modified DFG 800 of FIG. 8B. Synthesis engine 102 replaces the removed segments with the constant 0 being fed into logic 3 as an input. From modified DFG 800 of FIG. 8B, synthesis engine 102 is capable generating a netlist and resulting circuit implementation in the target IC that uses fewer circuit resources of the target IC.

The example illustrated with reference to FIGS. 8A and 8B may be applied to other logic operations beyond equality. In doing so, synthesis engine 102 is capable of eliminating entire paths of the DFG and, as such, entire paths of resulting circuitry corresponding to the removed paths. For example, anytime that a particular path, whether a true path or a false path can be eliminated, entire segments of the DFG graph may be removed.

Figure 9A:
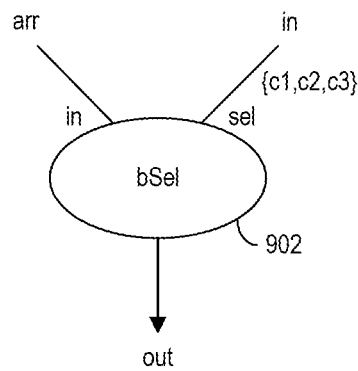
FIGS. 9A and 9B illustrate additional example DFG modifications.
Figure 9B:
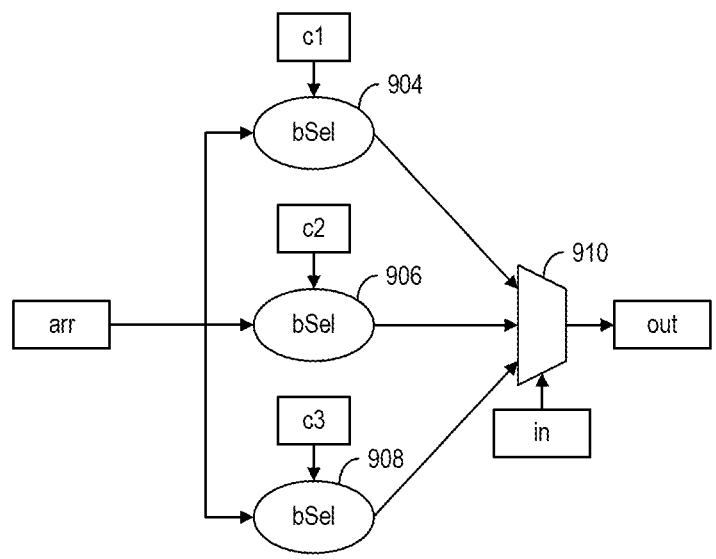

FIGS. 9A and 9B illustrate additional example DFG modifications. More particularly, FIGS. 9A and 9B illustrate an example of a variable select modification performed by synthesis engine 102.

In DFG 900 of FIG. 9A, a bit select node (bSel) 902 is created from a circuit design. Node 902 has a first input that receives a value from an array and a second input that chooses the particular bits of the value from the array that are selected and passed on as output from node 902. In the example of FIG. 9A, synthesis engine 102 has determined that the actual values that the select signal "sel" can take on are limited to {c1, c2, c3}. The structure of DFG 900 of FIG. 9A accounts for all possible values that the select signal "sel" may take on.

Synthesis engine 102 is capable of modifying DFG 900 of FIG. 9A to generate DFG 900 of FIG. 9B. In the example of FIG. 9B, DFG 900 includes a series of constant bit select nodes 904, 906, and 908 corresponding to c1, c2, and c3, respectively, that connect to a multiplexer 910. Multiplexer 910 is capable of selecting from the different ranges of the value corresponding to c1, c2, or c3.

DFG 900 of FIG. 9B reduces the size of the design significantly. While the example of FIG. 9B appears to be larger or more complex than that of FIG. 9A, the circuit implementation of nodes 904, 906, and 908 are simply wires. The circuit implementation of node 902 of FIG. 9A requires a significant amount of logic. Thus, the circuitry implemented in the target IC based on the example of FIG. 9B uses fewer LUTs than the circuitry generated from the example of FIG. 9A.

FIG. 10 illustrates an example method 1000 of processing a circuit design for implementation in a target IC. Method 1000 may be performed by a system as described herein in connection with FIG. 1. An example hardware architecture for implementing the system is described herein in connection with FIG. 11. An example architecture for a target IC is described herein in connection with FIG. 12.

In block 1002, the system is capable of converting a circuit design, specified in an HDL, into a DFG. The DFG is stored as a data structure in memory of the system. The circuit design may be specified as an RTL representation.

In block 1004, the system is capable of creating range set data structures in memory of the system. The range set data structures correspond to nodes of the DFG. For example, one or more range set data structures as described in connection with FIG. 2 may be generated for each node of the DFG. The system is also capable of initializing each range set data structure with the entire range of values (e.g., range information) the corresponding node can take on as specified by the circuit design.

For example, the system is capable of loading the range set data structure corresponding to each node of the DFG with the range that covers the entire set of values that the node is capable of taking on based on the data type specified in the circuit design. In illustration, if a variable is of type "byte," the node has a set of values enumerated from −128 to 127.

In one or more example implementations, the size of a set may be limited to a particular number of values to limit the amount of memory and runtime used to implement the refinements described herein. In the case of some large circuit designs, for example, runtime may be unacceptably lengthened and/or memory usage may be unacceptably high. In such cases, a limit on the size of a set may be imposed in the system. In one example, the limit may be set heuristically according to the synthesis tool. An example limit would be 1024 values to account for runtime and peak memory restrictions. In cases where the number of values on a node exceeds 1024 or the established limit, the system may skip processing that node.

In block 1006, the system is capable of determining actual values the nodes are capable of taking by propagating the values through the DFG. The system is capable of updating the range set data structures to store the actual values (e.g., range set information) for the corresponding nodes. For example, for each node, the system is capable of computing a set of input values receivable by the node and computing each possible output value output from the node based on the set of input values for the node and semantics of the node. The actual values stored in one or more of the range set data structures may include a plurality of non-contiguous values.

In one aspect, once the initial ranges are initialized as described in block 1004, the system is capable of traversing the DFG in a topological order. By traversing the DFG in topological order, the system ensures that ordered operations are in the correct direction for the data to propagate through the DFG. As another illustrative and non-limiting example, starting at the input pin of each node, the system is capable of computing the set of values each of the input pins of the node can take. Based on the semantics of the node, the system, computes the actual set of values the node can take. The actual values that constitute the range set will always be less than or equal to the initialized or default range. The system computes the actual value(s) for the output pin of the node so that the fanouts of the node can read that information. The system traverses the DFG and propagates the values by continuing this process.

In the case of a multiplexer type of node, for example, the system is capable of determining the values that the select input of the node can take. The system may mark those values of the input pins that match with the input range set. Using this process, if applicable, the system is capable of determining the particular input pins or values that the node will never pass. The system may use that information to prune the multiplexer node.

In block 1008, the system is capable of modifying a selected node of the DFG based on the actual values stored in the range set data structure of the selected node and the semantics of the selected node. For example, the system is capable of performing one or more modifications to the DFG including, but not limited to, reducing a size of the selected node, reducing a number of inputs of the selected node where the selected node is a multiplexer, and/or removing the selected node from the DFG. Subsequent to removing the selected node, the system may connect an input of the selected node directly to an output of the selected node.

In another example, once the traversal of the DFG is complete and the range set information for the nodes are updated, the system is capable of processing multiplexer nodes of the DFG. Using the range set information for the multiplexer nodes, the system is capable of remove any redundant and/or unused data inputs for such multiplexer nodes to create smaller multiplexer nodes that only have those inputs determined to have a possibility of arriving and being passed by the node.

In another example, in response to determining that a multiplexer node is left with only one valid input, the system is capable of removing the multiplexer node completely from the DFG. The system connects the single valid value directly to the output of the removed node.

In the absence of the refinements described herein, the DFG would need to enumerate all possible values for variables depending on the ranges determined from the circuit design. As discussed, this results in larger netlist and resulting circuit implementation in the target IC. The types of DFG refinements described within this disclosure result in a smaller netlist and resulting circuitry. Often, the types of refinements described within this disclosure cause a ripple effect in the DFG resulting in a netlist that is significantly smaller than would otherwise be the case.

Subsequent to modifying the DFG, the system is capable of generating a netlist from the modified DFG data structure. The system may perform further aspects of a design flow such as placement and/or routing. Further, the system may generate configuration data that, when loaded into a target IC, physically implements the circuit design therein. In this respect, synthesis engine 102 may be part of a larger EDA system capable of performing a design flow.

Figure 11:
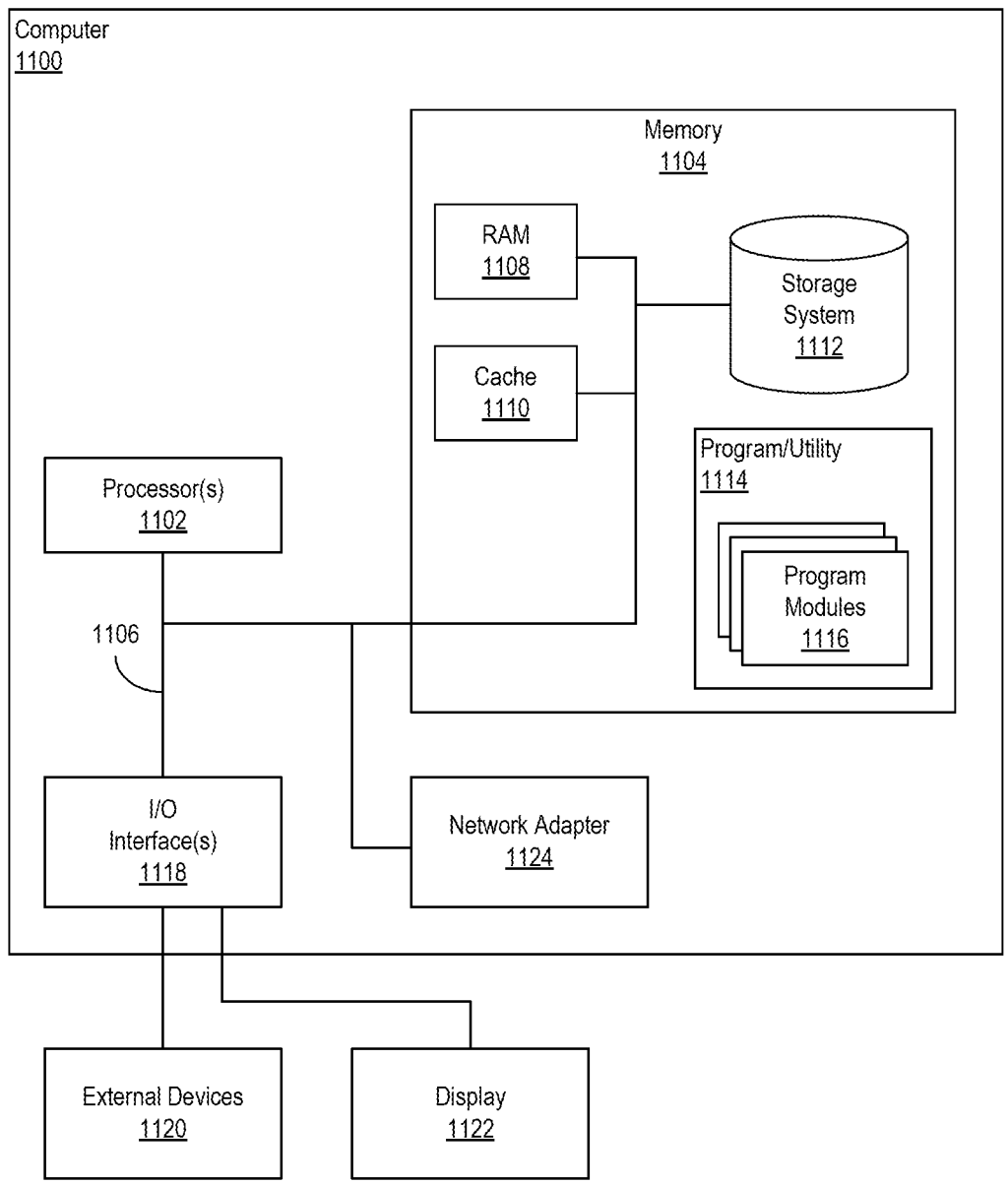
FIG. 11 illustrates an example computer.

FIG. 11 illustrates an example of a computer 1100. Computer 1100 is only one example implementation of a computer. Computer 1100 may be used in a standalone capacity, e.g., as a user computing device or a server, as part of a computing cluster (e.g., two or more interconnected computers), or as a cloud computing node. The example of FIG. 11 is not intended to suggest any limitation as to the scope of use or functionality of example implementations described herein. Computer 1100 is an example of a system and/or computer hardware that is capable of performing the various operations described within this disclosure.

Computer 1100 may be operational with numerous other general purpose or special purpose computing system environments or configurations. Examples of computing systems, environments, and/or configurations that may be suitable for use with computer 1100 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer 1100 can be described in the general context of computer system-executable instructions, such as program modules, that are executable by a computer system. Generally, program modules can include routines, programs, objects, components, logic, data structures, and so on that perform particular tasks or implement particular abstract data types. Computer 1100 can be practiced as a standalone computer system such as a server or in distributed cloud computing environments where tasks are performed by remote processing devices that are linked through a communications network. In a distributed cloud computing environment, program modules may be located in both local and remote computer system storage media including memory storage devices.

As shown in FIG. 11, the components of computer 1100 can include, but are not limited to, a processor 1102, a memory 1104, and a bus 1106 that couples various system components including memory 1104 to processor 1102. Processor 1102 may be implemented as one or more processors.

Bus 1106 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, Peripheral Component Interconnect (PCI) bus, and PCI Express (PCIe) bus.

Computer 1100 typically includes a variety of computer system readable media. Such media may include computer-readable volatile and non-volatile media and computer readable removable and non-removable media.

Memory 1104 can include computer readable media in the form of volatile memory, such as random-access memory (RAM) 1108 and/or cache memory 1110. Computer 1100 can also include other removable/non-removable, volatile/non-volatile computer storage media. By way of example, storage system 1112 can be provided for reading from and writing to a non-removable, non-volatile magnetic and/or solid-state media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 1106 by one or more data media interfaces. Memory 1104 is an example of at least one computer program product having a set (e.g., at least one) of program modules that are configured to carry out the functions of described herein.

Program/utility 1114, having a set (at least one) of program modules 1116, may be stored in memory 1104. By way of example, program modules 1116 may represent an operating system, one or more application programs, other program modules, and program data. Program modules 1116 generally carry out the functions and/or methodologies of the example implementations described within this disclosure. For example, one or more of the program modules can perform the various operations described within this disclosure relating to synthesis and/or other stages of a design flow.

Program/utility 1114 is executable by processor 1102. Program/utility 1114 and any data items used, generated, and/or operated upon by computer 1100 are functional data structures that impart functionality when employed by computer 1100. As defined within this disclosure, a "data structure" is a physical implementation of a data model's organization of data within a physical memory. As such, a data structure is formed of specific electrical or magnetic structural elements in a memory. A data structure imposes physical organization on the data stored in the memory as used by an application program executed using a processor.

Computer 1100 may also communicate with one or more external devices 1120 such as a keyboard, a pointing device, a display 1122, etc.; one or more devices that enable a user to interact with computer 1100; and/or any devices (e.g., network card, modem, etc.) that enable computer 1100 to communicate with one or more other computing devices. Such communication can occur via input/output (I/O) interfaces 1118. Still, computer 1100 can communicate with one or more networks such as a local area network (LAN), a general wide area network (WAN), and/or a public network (e.g., the Internet) via a network adapter 1124. As depicted, network adapter 1124 communicates with the other components of computer 1100 via bus 1106. It should be understood that although not shown, other hardware and/or software components could be used in conjunction with computer 1100. Examples, include, but are not limited to: microcode, device drivers, redundant processing units, external disk drive arrays, RAID systems, tape drives, and data archival storage systems, etc.

Computer 1100 is an example of a data processing system. As defined herein, "data processing system" means one or more hardware systems configured to process data, each hardware system including at least one processor programmed to initiate operations and memory.

Computer 1100 may include fewer components than shown or additional components not illustrated in FIG. 11 depending upon the particular type of device and/or system that is implemented. The particular operating system and/or application(s) included may vary according to device and/or system type as may the types of I/O devices included. Further, one or more of the illustrative components may be incorporated into, or otherwise form a portion of, another component. For example, a processor may include at least some memory.

Figure 12:
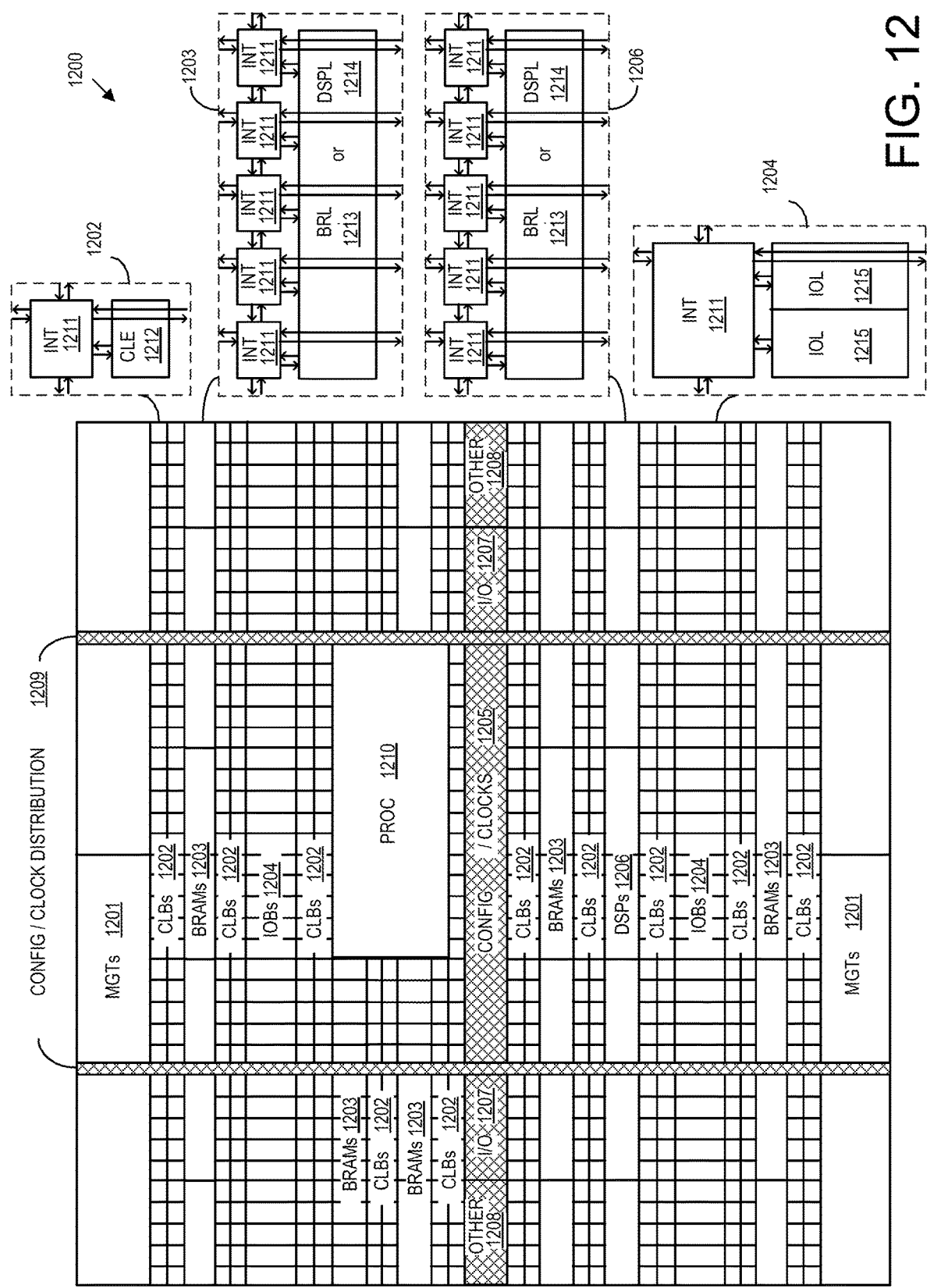
FIG. 12 illustrates an example architecture for an IC.

FIG. 12 illustrates an example architecture 1200 for an IC. In one aspect, architecture 1200 may be implemented within a programmable IC. For example, architecture 1200 may be used to implement a field programmable gate array (FPGA). Architecture 1200 may also be representative of a system-on-chip (SoC) type of IC. An SoC is an IC that includes a processor that executes program code and one or more other circuits. The other circuits may be implemented as hardwired circuitry, programmable circuitry, and/or a combination thereof. The circuits may operate cooperatively with one another and/or with the processor.

As shown, architecture 1200 includes several different types of programmable circuit, e.g., logic, blocks. For example, architecture 1200 may include a large number of different programmable tiles including multi-gigabit transceivers (MGTs) 1201, configurable logic blocks (CLBs) 1202, random access memory blocks (BRAMs) 1203, input/output blocks (IOBs) 1204, configuration and clocking logic (CONFIG/CLOCKS) 1205, digital signal processing blocks (DSPs) 1206, specialized I/O blocks 1207 (e.g., configuration ports and clock ports), and other programmable logic 1208 such as digital clock managers, analog-to-digital converters, system monitoring logic, and so forth.

In some ICs, each programmable tile includes a programmable interconnect element (INT) 1211 having standardized connections to and from a corresponding INT 1211 in each adjacent tile. Therefore, INTs 1211, taken together, implement the programmable interconnect structure for the illustrated IC. Each INT 1211 also includes the connections to and from the programmable logic element within the same tile, as shown by the examples included at the top of FIG. 12.

For example, a CLB 1202 may include a configurable logic element (CLE) 1212 that may be programmed to implement user logic plus a single INT 1211. A BRAM 1203 may include a BRAM logic element (BRL) 1213 in addition to one or more INTs 1211. Typically, the number of INTs 1211 included in a tile depends on the height of the tile. As pictured, a BRAM tile has the same height as five CLBs, but other numbers (e.g., four) also may be used. A DSP tile 1206 may include a DSP logic element (DSPL) 1214 in addition to an appropriate number of INTs 1211. An IOB 1204 may include, for example, two instances of an I/O logic element (IOL) 1215 in addition to one instance of an INT 1211. The actual I/O pads connected to IOL 1215 may not be confined to the area of IOL 1215.

In the example pictured in FIG. 12, a vertical area near the center of the die, e.g., formed of regions 1205, 1207, and 1208, may be used for configuration, clock, and other control logic. Horizontal areas 1209 extending from this vertical area may be used to distribute the clocks and configuration signals across the breadth of the programmable IC.

Some ICs utilizing the architecture illustrated in FIG. 12 include additional logic blocks that disrupt the regular columnar structure making up a large part of the IC. The additional logic blocks may be programmable blocks and/or dedicated circuitry. For example, a processor block depicted as PROC 1210 spans several columns of CLBs and BRAMs.

In one aspect, PROC 1210 may be implemented as dedicated circuitry, e.g., as a hardwired processor, that is fabricated as part of the die that implements the programmable circuitry of the IC. PROC 1210 may represent any of a variety of different processor types and/or systems ranging in complexity from an individual processor, e.g., a single core capable of executing program code, to an entire processor system having one or more cores, modules, co-processors, interfaces, or the like.

In another aspect, PROC 1210 may be omitted from architecture 1200 and replaced with one or more of the other varieties of the programmable blocks described. Further, such blocks may be utilized to form a "soft processor" in that the various blocks of programmable circuitry may be used to form a processor that can execute program code as is the case with PROC 1210.

The phrase "programmable circuitry" refers to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, circuit blocks shown in FIG. 12 that are external to PROC 1210 such as CLBs 1202 and BRAMs 1203 are considered programmable circuitry of the IC.

In general, the functionality of programmable circuitry is not established until configuration data is loaded into the IC. A set of configuration bits may be used to program programmable circuitry of an IC such as an FPGA. The configuration bit(s) typically are referred to as a "configuration bitstream." In general, programmable circuitry is not operational or functional without first loading a configuration bitstream into the IC. The configuration bitstream effectively implements a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 1210.

In some instances, hardwired circuitry may have one or more operational modes that can be set or selected according to register settings or values stored in one or more memory elements within the IC. The operational modes may be set, for example, through the loading of a configuration bitstream into the IC. Despite this ability, hardwired circuitry is not considered programmable circuitry as the hardwired circuitry is operable and has a particular function when manufactured as part of the IC.

In the case of an SoC, the configuration bitstream may specify the circuitry that is to be implemented within the programmable circuitry and the program code that is to be executed by PROC 1210 or a soft processor. In some cases, architecture 1200 includes a dedicated configuration processor that loads the configuration bitstream to the appropriate configuration memory and/or processor memory. The dedicated configuration processor does not execute user-specified program code. In other cases, architecture 1200 may utilize PROC 1210 to receive the configuration bitstream, load the configuration bitstream into appropriate configuration memory, and/or extract program code for execution.

FIG. 12 is intended to illustrate an example architecture that may be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the right of FIG. 12 are purely illustrative. In an actual IC, for example, more than one adjacent column of CLBs is typically included wherever the CLBs appear, to facilitate the efficient implementation of a user circuit design. The number of adjacent CLB columns, however, may vary with the overall size of the IC. Further, the size and/or positioning of blocks such as PROC 1210 within the IC are for purposes of illustration only and are not intended as limitations.

The example implementations described herein may be used to process circuit designs intended for implementation in programmable ICs (e.g., ICs that include at least some programmable circuitry) and/or ICs that include no programmable circuitry. For example, a system as described herein is capable of performing operations on a DFG as part of synthesizing a circuit design intended for implementation in any of a variety of different types of ICs including Application-Specific ICs (ASICs).

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise.

As defined herein, the term "approximately" means nearly correct or exact, close in value or amount but not precise. For example, the term "approximately" may mean that the recited characteristic, parameter, or value is within a predetermined amount of the exact characteristic, parameter, or value.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without human intervention. As defined herein, the term "user" means a human being.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. The various forms of memory, as described herein, are examples of computer readable storage media. A non-exhaustive list of more specific examples of a computer readable storage medium may include: a portable computer diskette, a hard disk, a RAM, a read-only memory (ROM), an erasable programmable read-only memory (EPROM or Flash memory), an electronically erasable programmable read-only memory (EEPROM), a static random access memory (SRAM), a portable compact disc read-only memory (CD-ROM), a digital versatile disk (DVD), a memory stick, a floppy disk, or the like.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the terms "one embodiment," "an embodiment," "one or more embodiments," "particular embodiments," or similar language mean that a particular feature, structure, or characteristic described in connection with the embodiment is included in at least one embodiment described within this disclosure. Thus, appearances of the phrases "in one embodiment," "in an embodiment," "in one or more embodiments," "in particular embodiments," and similar language throughout this disclosure may, but do not necessarily, all refer to the same embodiment. The terms "embodiment" and "arrangement" are used interchangeably within this disclosure.

As defined herein, the term "processor" means at least one circuit capable of carrying out instructions contained in program code. The circuit may be an integrated circuit or embedded in an integrated circuit.

As defined herein, the term "soft" in reference to a circuit means that the circuit is implemented in programmable logic or programmable circuitry. Thus, a "soft processor" means at least one circuit implemented in programmable circuitry that is capable of carrying out instructions contained in program code.

As defined herein, the term "output" means storing in physical memory elements, e.g., devices, writing to display or other peripheral output device, sending or transmitting to another system, exporting, or the like.

As defined herein, the term "real time" means a level of processing responsiveness that a user or system senses as sufficiently immediate for a particular process or determination to be made, or that enables the processor to keep up with some external process.

As defined herein, the term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc. may be used herein to describe various elements. These elements should not be limited by these terms, as these terms are only used to distinguish one element from another unless stated otherwise or the context clearly indicates otherwise.

A computer program product may include a computer readable storage medium (or media) having computer readable program instructions thereon for causing a processor to carry out aspects of the inventive arrangements described herein. Within this disclosure, the term "program code" is used interchangeably with the term "computer readable program instructions." Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object oriented programming language and/or procedural programming languages. Computer readable program instructions may include state-setting data. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. A computer-based method of performing synthesis, the method comprising:
converting, using computer hardware, a circuit design, specified in a hardware description language, into a data flow graph;
creating, using the computer hardware, range set data structures in a memory, the range set data structures corresponding to nodes of the data flow graph, wherein each range set data structure is initialized with a range of values for the corresponding node, wherein the range of values is determined by a bit size of a value output from the corresponding node as specified by the circuit design;
determining, using the computer hardware, actual values the nodes output by propagating the values of the range of values through the data flow graph, wherein the range set data structures are updated to store the actual values output by the corresponding nodes from the propagating;
modifying, using the computer hardware, a selected node of the data flow graph based on the actual values stored in the range set data structure of the selected node and semantics of the selected node, wherein the modifying reduces a number of inputs of the selected node;
generating, using the computer hardware, a netlist from the data flow graph as modified; and
physically implementing the circuit design, as specified by the netlist, in an integrated circuit.

2. The computer-based method of claim 1, wherein the actual values stored in at least one range set data structure include a plurality of non-contiguous values.

3. The computer-based method of claim 1, wherein the selected node of the data flow graph is reduced in size.

4. The computer-based method of claim 1, wherein the selected node corresponds to a multiplexer and a number of inputs to the selected node is reduced.

5. The computer-based method of claim 1, wherein the selected node is removed from the data flow graph.

6. The computer-based method of claim 5, wherein, subsequent to removal, an input of the selected node is connected to an output of the selected node.

7. The computer-based method of claim 1, wherein the actual values stored in the range set data structures are stored as one or more contiguous ranges.

8. The computer-based method of claim 1, wherein the determining the actual values comprises, for each node, computing a set of input values receivable by the node and computing each possible output value output from the node based on the set of input values for the node and semantics of the node.

9. A system, comprising:
a processor configured to initiate operations that implement synthesis including:
converting a circuit design, specified in a hardware description language, into a data flow graph;
creating range set data structures in a memory of the system, the range set data structures corresponding to nodes of the data flow graph, wherein each range set data structure is initialized with a range of values for the corresponding node, wherein the range of values is determined by a bit size of a value output from the corresponding node as specified by the circuit design;
determining actual values the nodes output by propagating the values of the range of values through the data flow graph, wherein the range set data structures are updated to store the actual values output by the corresponding nodes from the propagating;
modifying a selected node of the data flow graph based on the actual values stored in the range set data structure of the selected node and semantics of the selected node, wherein the modifying reduces a number of inputs of the selected node;
generating a netlist from the data flow graph as modified; and
physically implementing the circuit design, as specified by the netlist, in an integrated circuit.

10. The system of claim 9, wherein the actual values stored in at least one range set data structure include a plurality of non-contiguous values.

11. The system of claim 9, wherein the selected node of the data flow graph is reduced in size.

12. The system of claim 9, wherein the selected node corresponds to a multiplexer and a number of inputs to the selected node is reduced.

13. The system of claim 9, wherein the selected node is removed from the data flow graph.

14. The system of claim 13, wherein, subsequent to removal, an input of the selected node is connected to an output of the selected node.

15. The system of claim 9, wherein the actual values stored in the range set data structures are stored as one or more contiguous ranges.

16. The system of claim 9, wherein the determining the actual values comprises, for each node, computing a set of input values receivable by the node and computing each possible output value output from the node based on the set of input values for the node and semantics of the node.

17. A computer program product, comprising:
one or more computer readable storage media, and program instructions collectively stored on the one or more computer readable storage media, wherein the program instructions are executable by computer hardware to initiate operations that implement synthesis, the operations including:

converting a circuit design, specified in a hardware description language, into a data flow graph;

creating range set data structures in a memory, the range set data structures corresponding to nodes of the data flow graph, wherein each range set data structure is initialized with a range of values for the corresponding node, wherein the range of values is determined by a bit size of a value output from the corresponding node as specified by the circuit design;

determining actual values the nodes output by propagating the values of the range of values through the data flow graph, wherein the range set data structures are updated to store the actual values output by the corresponding nodes from the propagating;

modifying a selected node of the data flow graph based on the actual values stored in the range set data structure of the selected node and semantics of the selected node, wherein the modifying reduces a number of inputs of the selected node;

generating a netlist from the data flow graph as modified; and physically implementing the circuit design, as specified by the netlist, in an integrated circuit.

18. The computer program product of claim 17, wherein the actual values stored in at least one range set data structure include a plurality of non-contiguous values.

19. The computer program product of claim 17, wherein the modifying comprises at least one of:

reducing the selected node of the data flow graph in size; or the selected node corresponds to a multiplexer and a number of inputs to the selected node is reduced.

20. The computer program product of claim 17, wherein the selected node is removed from the data flow graph.

\* \* \* \* \*